United States Patent
Iwade et al.

(10) Patent No.: US 9,048,359 B2
(45) Date of Patent: Jun. 2, 2015

(54) SOLAR CELL MODULE AND MANUFACTURING METHOD THEREOF

(75) Inventors: Takashi Iwade, Otsu (JP); Toyoharu Terada, Otsu (JP); Kazunori Nakakita, Otsu (JP); Hirofumi Sakai, Otsu (JP); Yuichiro Tsuda, Otsu (JP)

(73) Assignee: TORAY ENGINEERING CO., LTD., Tokyo (JP)

( * ) Notice: Subject to any disclaimer, the term of this patent is extended or adjusted under 35 U.S.C. 154(b) by 97 days.

(21) Appl. No.: 13/993,926

(22) PCT Filed: Oct. 4, 2011

(86) PCT No.: PCT/JP2011/072815
§ 371 (c)(1),
(2), (4) Date: Jun. 13, 2013

(87) PCT Pub. No.: WO2012/086286
PCT Pub. Date: Jun. 28, 2012

(65) Prior Publication Data
US 2013/0263912 A1    Oct. 10, 2013

(30) Foreign Application Priority Data
Dec. 22, 2010 (JP) ................... 2010-285657

(51) Int. Cl.
| | |
|---|---|
| *H02N 6/00* | (2006.01) |
| *H01L 31/042* | (2014.01) |
| *H01L 21/00* | (2006.01) |
| *H01L 31/05* | (2014.01) |
| *H01L 31/02* | (2006.01) |
| *H01L 31/048* | (2014.01) |
| *H01L 31/046* | (2014.01) |

(52) U.S. Cl.
CPC ........ *H01L 31/0508* (2013.01); *H01L 31/0504* (2013.01); *Y02E 10/50* (2013.01); *H01L 31/0201* (2013.01); *H01L 31/048* (2013.01); *H01L 31/046* (2014.12)

(58) Field of Classification Search
CPC ..... H01L 25/04; H01L 25/041; H01L 25/042; H01L 25/043; H01L 25/045
See application file for complete search history.

(56) References Cited

U.S. PATENT DOCUMENTS

| 4,617,421 A * | 10/1986 | Nath et al. ................. 136/244 |
| 2002/0017900 A1* | 2/2002 | Takeda et al. ............. 323/906 |

FOREIGN PATENT DOCUMENTS

| JP | 06-140651 A | 5/1994 |
| JP | 2001-203380 A | 7/2001 |

(Continued)

OTHER PUBLICATIONS

International Search Report of corresponding International Application No. PCT/JP2011/072815, dated on Dec. 27, 2011.

*Primary Examiner* — Eli Mekhlin
(74) *Attorney, Agent, or Firm* — Global IP Counselors, LLP

(57) ABSTRACT

A solar cell module includes a plurality of solar cells arranged next to one another in a first direction orthogonal to a second direction. The solar cells each include a lower conductive layer, an upper conductive layer, and a power generating layer. Adjacent solar cells include edge portions overlapped and electrically connected with each other. Each of the solar cells further includes end processed regions at both ends thereof and a main power generating region in a middle portion thereof. The end processed regions prevent a short-circuit between the upper conductive layer and the lower conductive layer. The main power generating region performs photoelectric conversion. The edge portion of one of the adjacent solar cells overlaps from above with the edge portion of the other one of the adjacent solar cells within a range of the main power generating region of the other one of the adjacent solar cells.

9 Claims, 10 Drawing Sheets

(56) References Cited

FOREIGN PATENT DOCUMENTS

| | | | |
|---|---|---|---|
| JP | 2005-123445 | A | 5/2005 |
| JP | 2008-294264 | A | 12/2008 |
| JP | 2009-10355 | A | 1/2009 |
| JP | 2009-130193 | A | 6/2009 |
| WO | 2010/023264 | A2 | 3/2010 |

* cited by examiner

SOLAR CELL MODULE AND MANUFACTURING METHOD THEREOF

CROSS-REFERENCE TO RELATED APPLICATIONS

This application is a U.S. National stage of International Application No. PCT/JP2011/072815 filed on Oct. 14, 2011. This application claims priority to Japanese Patent Application No. 2010-285657 filed with Japan Patent Office on Dec. 22, 2010. The entire disclosure of Japanese Patent Application No. 2010-285657 is hereby incorporated herein by reference.

BACKGROUND

1. Field of the Invention

The present invention relates to a solar cell module including a plurality of solar cells, and a manufacturing method thereof.

2. Background Information

As a solar cell module, a slat type having a plurality of elongated solar cells arranged next to and connected to one another is known (for example, see FIG. 7 of WO 2010/023264 A (Patent Document 1)), and this solar cell module is manufactured in the following manner, for example.

An elongated solar cell is obtained by sending out a belt-like metal material wound around a roll, applying various types of coating to form a solar cell on the metal material, and then, cutting to a predetermined length. This solar cell includes, as shown in FIG. 9(a), a power generating layer 91 (for example, a semiconductor layer) and a transparent conductive film (an upper conductive layer) 90 above a metal substrate (a lower conductive layer) 92 formed from the metal material.

Then, a plurality of solar cells are arranged next to one another and the edge portions of adjacent solar cells are overlapped with each other and bonded by bonding metal such as solder to form one solar cell module. The solar cell module manufactured in this manner has a plurality of solar cells electrically connected in series, and is capable of obtaining useful voltage.

If the metal material which has been coated in the manner described above is cut (sheared) to a predetermined length, since the film thicknesses of the transparent conductive film 90 and the power generating layer 91 in particular are thin (several μm), there is a possibility that the transparent conductive film 90 and the metal substrate 92 are short-circuited (electrically short-circuited) at a cut surface 93.

Accordingly, as shown in FIG. 9(b), a scribed groove 94 where at least the transparent conductive film 90 is removed by a predetermined width g is formed at both ends of the solar cell, and an end region including the scribed groove 94 is taken as a processed region B1. This configuration prevents a short-circuit between the transparent conductive film 90 and the metal substrate 92 at a main power generating region (a region where photoelectric conversion is actually performed) B2 in the middle excluding the processed region B1, and the function of a solar cell module is secured. Additionally, even if an isolated transparent conductive film portion 90a and the metal substrate 92 are short-circuited in the processed region B1, photoelectric conversion at the main power generating region B2 is not affected.

Furthermore, as shown in FIG. 9(c), by performing a blasting process on both ends of the solar cell and forming the processed regions B1, the same function as in the case of FIG. 9(b) may be achieved.

SUMMARY

As described above, although it is possible to prevent a short-circuit which may occur on a per solar cell basis, if edge portions 95a and 96a of adjacent solar cells 95 and 96 are overlapped with each other, as shown in a plan view of a solar cell module of FIG. 10(a), a short-circuit may occur due to these edge portions 95a and 96a coming into contact.

That is, as shown in a cross-sectional view of FIG. 10(b), with the edge portions 95a and 96a of the solar cells 95 and 96 overlapped with a bonding metal 97 such as solder or the like interposed therebetween, the transparent conductive film 90a in the processed region B1 of the solar cell 96 below and the metal substrate 92 of the solar cell 95 on the top may be short-circuited by coming into contact with each other. In this case, the solar cells 95 and 96 on the top and below are not connected in series. Moreover, in a mode where the blasting process is performed on both ends as shown in FIG. 10(c), since the film thicknesses of the transparent conductive film 90 and the power generating layer 91 are thin, the metal substrates 92 and 92 on the top and below may be short-circuited by coming into contact with each other, and in this case, the solar cells 95 and 96 on the top and below are not connected in series.

As described above, conventionally, there is a problem that there is a possibility of a short-circuit occurring between the solar cells 95 and 96. Additionally, with the solar cell module described in Patent Document 1 mentioned above, a short-circuit between solar electric cells is prevented by separately providing insulating material at the ends of the solar cells, but in this case, insulating material has to be added to each solar cell, and also, a process of attaching the insulating material becomes necessary, and the cost is increased.

Accordingly, the present invention has its object to provide a solar cell module capable of preventing a short-circuit between solar cells by a simple structure, and a manufacturing method thereof.

(1) The present invention is a solar cell module including a plurality of solar cells arranged next to one another in a direction orthogonal to a longitudinal direction of the solar cells, the solar cells each being long in one direction and including a lower conductive layer, an upper conductive layer, and a power generating layer between the upper and lower conductive layers, and the adjacent solar cells including edge portions overlapped and electrically connected with each another, wherein each of the solar cells includes end processed regions, at both ends, where a process for preventing short-circuit between the upper conductive layer and the lower conductive layer has been performed, and a main power generating region in a middle where photoelectric conversion is actually performed, and wherein an edge portion of another solar cell that overlaps from above with an edge portion of the solar cell overlaps within a range of the main power generating region of the solar cell below.

According to the present invention, with respect to adjacent solar cells whose edge portions are overlapped with each other, the edge portion of another solar cell (referred to a second cell) that overlaps from above with the edge portion of a solar cell below (referred to as a first cell) overlaps within the range of the main power generating region of the first cell, and thus, the second cell does not overlap with the end processed region of the first cell. Accordingly, the end processed region of the first cell and the lower conductive layer of the second cell on the top are not short-circuited. According to the present invention described above, a conventional problem of a short-circuit between solar cells may be prevented by a simple structure.

(2) Moreover, the other solar cell on top and the main power generating region are preferably shaped so as to expand in the one direction as the other solar cell and the main power generating region are separated from the edge portion of the solar cell below.

The edge portion of another solar cell (referred to as a second cell) that is to overlap from above with the edge portion of a solar cell below (referred to as a first cell) has a width equal to or less than the width dimension of the main power generating region of the first cell so as to overlap within the main power generating region, and thus, if the second cell is rectangular, the overall width of the second cell will be narrower than the width of the main power generating region of the first cell. However, according to the structure described in (2) above, the second cell and the main power generating region are shaped so as to expand in the one direction (the longitudinal direction of the solar cell) as they are separated from the edge portion of the first cell below, and thus, the areas of the second cell and the main power generating region may be prevented from being reduced. Accordingly, the width of a solar cell that is to further overlap from above with the second cell, and the width of a solar cell that is to even further overlap from above may be prevented from gradually narrowing, and the width dimension of the solar cell module may be prevented from being reduced as the solar cells are connected one after the other.

(3) Furthermore, the present invention is a manufacturing method of manufacturing a solar cell module by arranging a plurality of solar cells next to one another in a direction orthogonal to a longitudinal direction of the solar cells, and overlapping and electrically connecting edge portions of adjacent solar cells with each other, the solar cells each being long in one direction and including a lower conductive layer, an upper conductive layer, and a power generating layer between the upper and lower conductive layers, the manufacturing method including a cell manufacturing step of performing a process for preventing a short-circuit between the upper conductive layer and the lower conductive layer at both ends of each of the solar cells, and of forming a main power generating region where photoelectric conversion is actually performed in a middle region excluding the both ends, and a bonding step of electrically connecting edge portions by causing an edge portion of another solar cell to overlap from above with an edge portion of a solar cell and causing the lower conductive layer of the other solar cell to overlap from above with the upper conductive layer of the solar cell below, wherein the bonding step is repeatedly performed for the plurality of solar cells, and the edge portion of the other solar cell is overlapped within a range of the main power generating region of the solar cell below in each bonding step.

According to the present invention, the solar cell module described in (1) above may be manufactured. Thus, the end processed region of a solar cell below and the lower conductive layer of another solar cell on the top are not short-circuited, and a conventional problem of short-circuit between solar cells may be prevented by a simple structure.

According to the present invention, a solar cell on the top does not overlap with an end processed region of a solar cell below, and thus, the end processed region of the solar cell below and a lower conductive layer of the solar cell on the top are not short-circuited, and a short-circuit between the solar cells may be prevented by a simple structure.

DETAILED DESCRIPTION OF EMBODIMENTS

Figure 1:
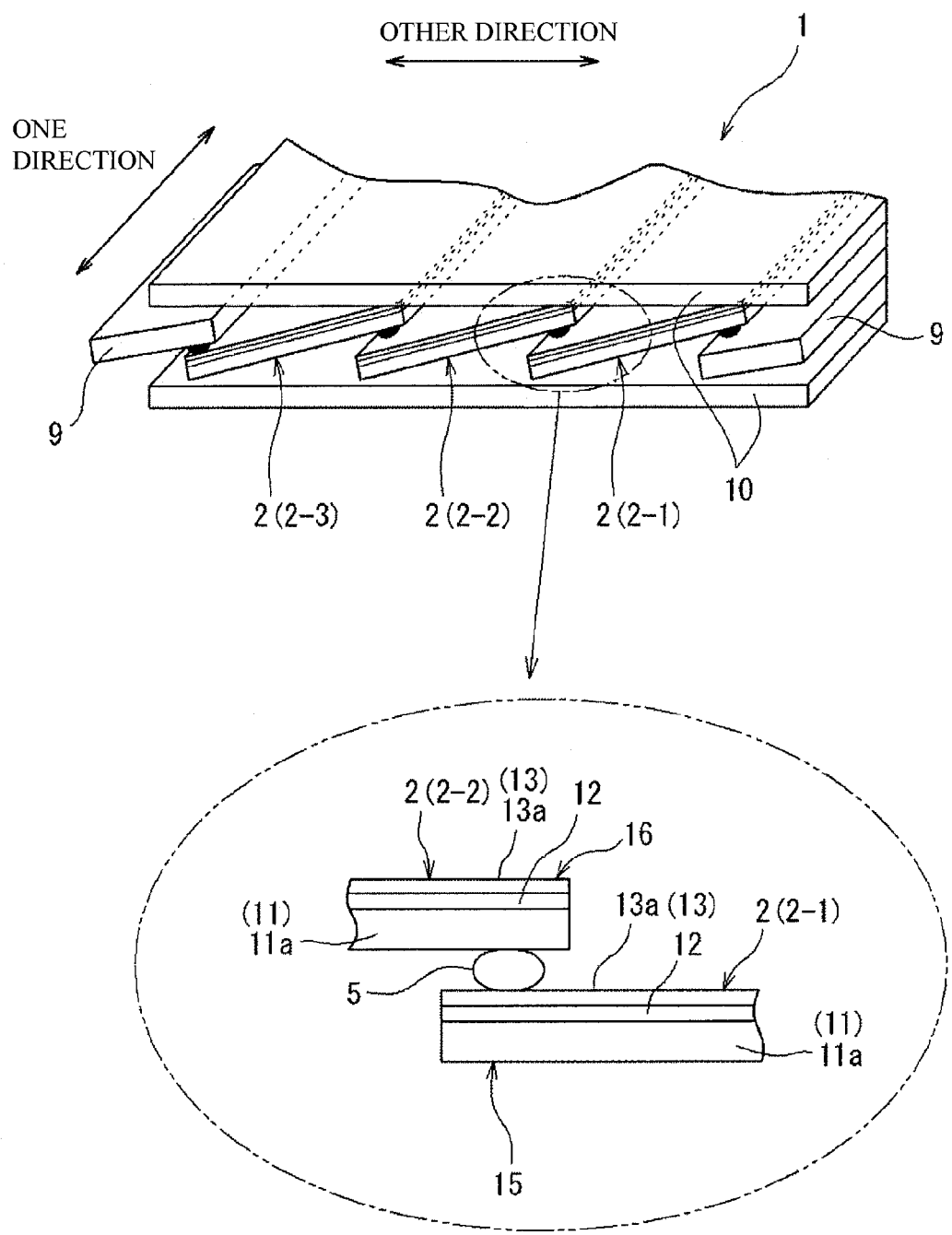
FIG. 1 is a perspective view showing an embodiment of a solar cell module of the present invention.

Hereinafter, embodiments of the present invention will be described based on the drawings. Overall configuration of a solar cell module will now be described. FIG. 1 is a perspective view showing an embodiment of a solar cell module of the present invention. This solar cell module 1 (hereinafter also referred to as "module 1") includes a plurality of solar cells 2 (hereinafter also referred to as "cell 2") that are elongated in one direction and that are arranged next to one another, and an electrode 9 is provided on both sides of the plurality of cells 2. The cells 2 have a strip shape that is elongated in the one direction, and this one direction (the longitudinal direction of the cells 2) and the direction of arrangement of the cells 2 along which the cells 2 are arranged (hereinafter referred to the other direction) are orthogonal. Additionally, in FIG. 1, there are only three cells 2 (cells 2-1, 2-2 and 2-3) to simplify the explanation, but an actual module includes more than three cells.

These cells 2 and electrodes 9 are sandwiched by cover members 10 from both surfaces, and the module 1 is formed as one sheet. The cover members 10 on both surfaces are formed from a flexible film resin member through which sunlight is transmitted, and are closely adhered to the front surface and the back surface of the cells 2 and the electrodes 9. Additionally, FIG. 1 shows a state where the cover members 10 are separated from the cells 2.

Each cell 2 is configured by stacking, on a conductive substrate 11*a* having conductivity, a semiconductor layer 12 as a power generating layer and an upper electrode 13*a* in this order. That is, a lower conductive layer 11 is formed from the conductive substrate 11*a*, and an upper conductive layer 13 is formed from the upper electrode 13*a*, and the semiconductor layer 12 is interposed between these upper and lower conductive layers 11 and 13.

The conductive substrate 11*a* is made of stainless steel, the semiconductor layer 12 is of amorphous silicon, CIGS or the like, and the upper electrode 13*a* is a transparent electrode and is, for example, of indium tin oxide. Additionally, each member is not restricted to the above.

Edge portions 15 and 16 of adjacent cells 2 and 2 are in a state of being overlapped with each other by bonding metal from above and below, and the cells 2 and 2 are electrically and structurally connected by the bonding metal at the edge portions 15 and 16 that are overlapped. The edge portions 15 and 16 that are overlapped are referred to as overlapping edge portions. The bonding metal is solder 5, for example. The solder 5 is provided being scattered along the edge portion 16 of the cell 2 (along the one direction). Moreover, conductive films may be interposed between the solder 5 and the cells 2 and 2 on the top and below.

According to the above, the lower conductive layer 11 of another cell 2 overlaps from above with the upper conductive layer 13 of the cell 2 below by bonding metal such as the solder 5 or the like, and the cells 2 and 2 are electrically connected by this bonding metal. Moreover, with respect to the other direction, each of the cells 2 and 2 at both ends is electrically and structurally connected with the electrode 9 by the solder. According to this structure, a plurality of cells 2 are in a state of being electrically connected in series, and useful voltage may be obtained.

Figure 2:
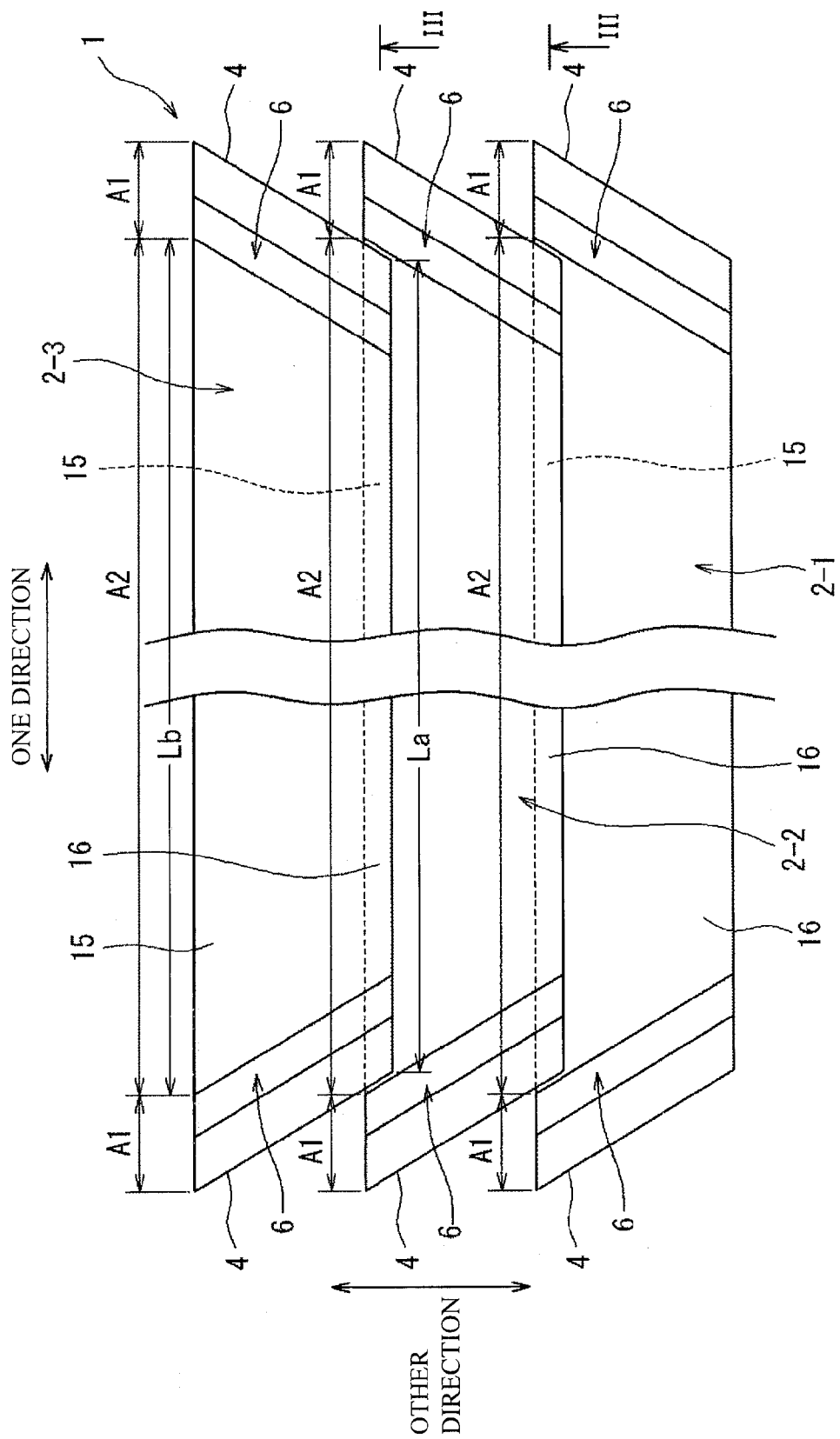
FIG. 2 is a plan view of a solar cell module according to a first embodiment.
Figure 3:
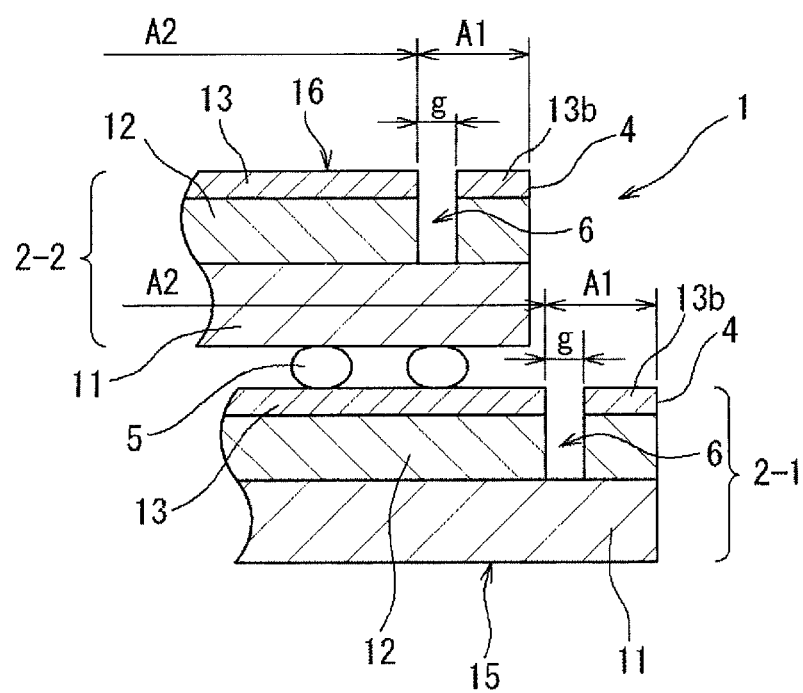
FIG. 3 is a cross-sectional view of FIG. 2 in the direction of an arrow III.

The solar cells 2 will now be described in detail. FIG. 2 is a plan view of the module 1 according to a first embodiment, and FIG. 3 is a cross-sectional view of FIG. 2 in the direction of an arrow III. Moreover, this module 1 includes a first cell 2-1, a second cell 2-2, and a third cell 2-3, and these cells are all formed in the same manner. Moreover, the connection mode of the first cell 2-1 and the second cell 2-2, and the connection mode of the second cell 2-2 and the third cell 2-3 are the same, and the first cell 2-1 and the second cell 2-2 are described in FIG. 3.

Each of the cells 2-1, 2-2 and 2-3 has end processed regions A1 and A1 at both ends in the one direction, and a main power generating region A2 in the middle. The main power generating region A2 is a region where photoelectric conversion is actually performed, that is, a region where power is generated, and is a region that is electrically in series with other cells. The end processed region A1 is a region where a process for preventing a short-circuit between the upper conductive layer 13 and the lower conductive layer 11 at the main power generating region A2 of each cell has been performed. In the present embodiment, scribed grooves 6 are formed at both ends of each cell by removing the upper conductive layer 13 by a predetermined width g, and an end region including the scribed groove 6 is taken as the end processed region A1. The main power generating region A2 is sufficiently larger compared to the end processed region A1, and is larger than the total area of the end processed regions A1 and A1 at both sides.

As will be described later with respect to a manufacturing method, an end surface 4 of each cell is a cut surface, and there is a possibility that a short-circuit occurs between the upper conductive layer 13 and the lower conductive layer 11 at the cut surface, but with the end processed region A1, a short-circuit between the upper conductive layer 13 and the lower conductive layer 11 may be prevented at the main power generating region A2. Additionally, even if an isolated part 13b of the upper conductive layer and the lower conductive layer 11 are short-circuited at the end processed region A1 of each cell, photoelectric conversion at the main power generating region A2 is not affected.

Furthermore, to obtain the end processed region A1, the scribed groove 6 is formed at at least the upper conductive layer 13, but in the present embodiment, the scribed groove 6 is formed by removing the upper conductive layer 13 and the semiconductor layer 12 by the predetermined width g.

In the present embodiment (FIG. 2), each cell has a trapezoidal shape that is elongated in the one direction in plan view, and has the edge portion 15 on the long side and the edge portion 16 on the short side. Moreover, the scribed grooves 6 are linearly formed in parallel with the sides (the end surfaces 4) on both sides in the one direction of the cell. That is, the scribed grooves 6 are tilted with respect to the one direction (the longitudinal direction of the cell). Thus, the main power generating region A2 is a trapezoid in plan view, and the end processed region A1 is a parallelogram.

With respect to the first cell 2-1 and the second cell 2-2 that are adjacent to each other, the edge portion 16 on the short side of the second cell 2-2 overlaps from above with the edge portion 15 on the long side of the first cell 2-1 below. Moreover, with the second cell 2-2 and the third cell 2-3 that are adjacent to each other, the edge portion 16 on the short side of the third cell 2-3 overlaps from above with the edge portion 15 on the long side of the second cell 2-2 below.

Moreover, the shape of each cell 2 is set such that a length La in the one direction of the edge portion 16 on the short side of each cell is shorter than a length Lb in the one direction of the main power generating region A2 at the edge portion 15 on the long side of the corresponding cell.

Then, when focusing on the first cell 2-1 and the second cell 2-2 that are adjacent to each other, the edge portion 16 on the short side of the second cell 2-2 that overlaps from above with the edge portion 15 on the long side of the first cell 2-1 overlaps only within the range of the main power generating region A2 of the first cell 2-1 below. Likewise, when focusing on the second cell 2-2 and the third cell 2-3, the edge portion 16 on the short side of the third cell 2-3 that overlaps from above with the edge portion 15 on the long side of the second cell 2-2 overlaps only within the range of the main power generating region A2 of the second cell 2-2 below.

As described above, with the module 1 of the present invention, the edge portion of one cell (the cell on the top), of the adjacent cells whose edge portions are overlapped, which overlaps from above with the edge portion of the other cell (the cell below) overlaps only within the range of the main power generating region A2 of the cell below.

Accordingly, in FIGS. 2 and 3, the second cell 2-2 on the top does not overlap from above with the end processed region A1 of the first cell 2-1 below. Therefore, the end processed region A1 (a part 13b of the upper conductive layer) of the first cell 2-1 below and the lower conductive layer 11 of the second cell 2-2 on the top are not short-circuited. Moreover, with respect to the second cell 2-2 and the third cell 2-3, the third cell 2-3 on the top does not overlap from above with the end processed region A1 of the second cell 2-2 below. Accordingly, the end processed region A1 (a part of the upper conductive layer) of the second cell 2-2 below and the lower conductive layer 11 of the third cell 2-3 on the top are not short-circuited.

Therefore, according to the module 1, all the cells are electrically connected in series, and useful voltage may be obtained.

Second Embodiment

Figure 4:
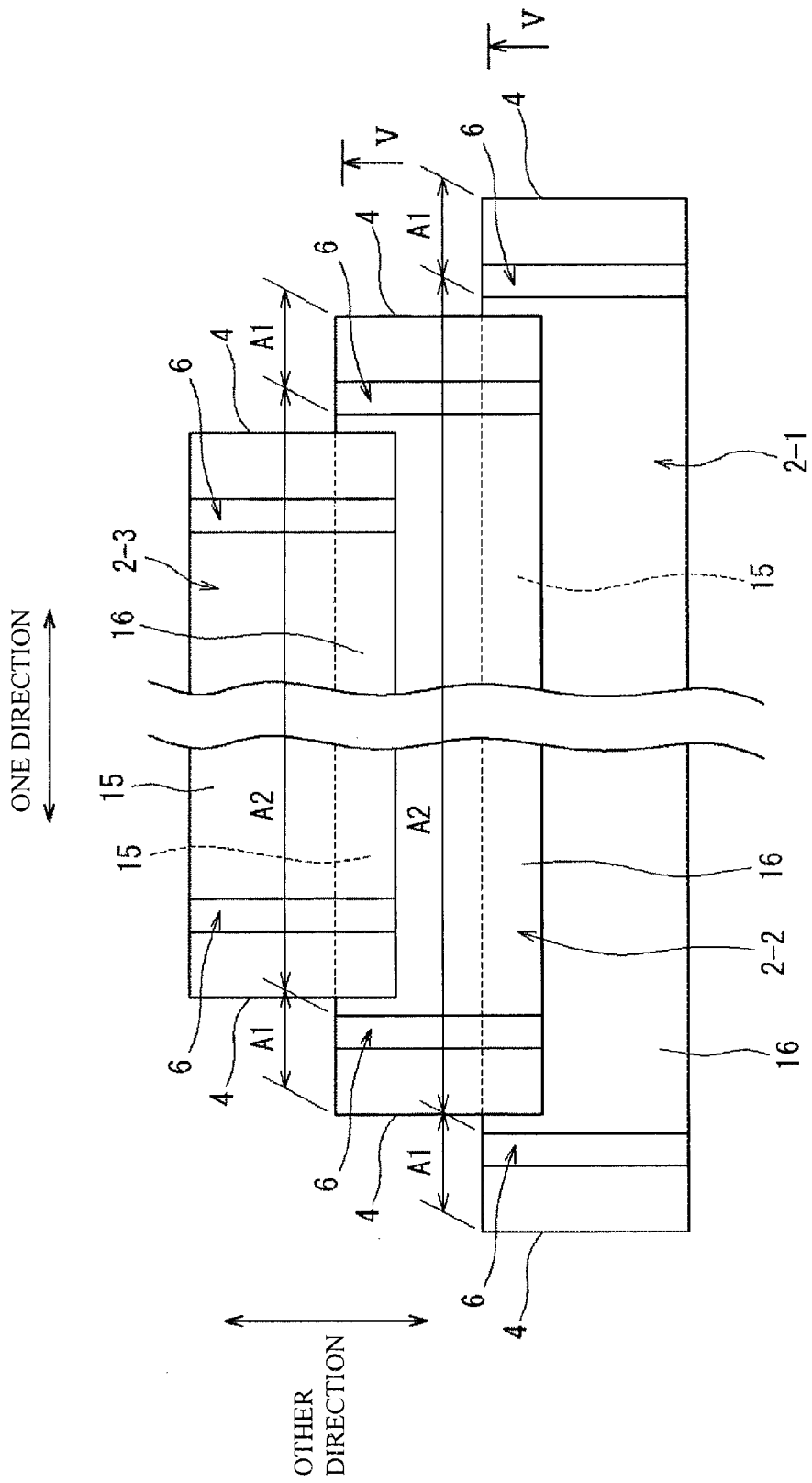
FIG. 4 is a plan view of a solar cell module according to a second embodiment.
Figure 5:
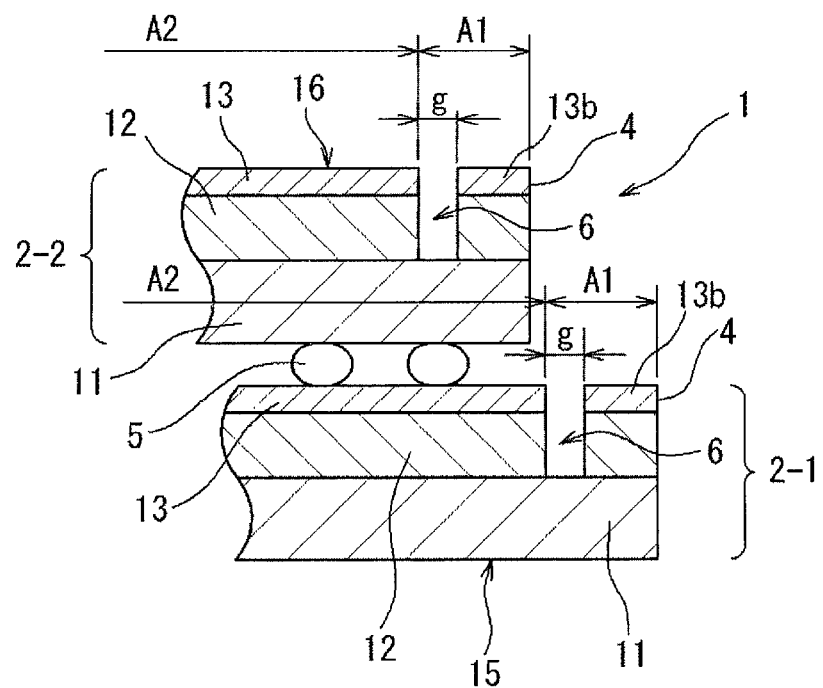
FIG. 5 is a cross-sectional view of FIG. 4 in the direction of an arrow V.

FIG. 4 is a plan view of a module 1 according to a second embodiment. FIG. 5 is a cross-sectional view of FIG. 4 in the direction of an arrow V. This second embodiment is an example modification of the first embodiment. When compared with the first embodiment (FIG. 2), the module 1 according to the second embodiment is different in the shape of a cell 2. That is, a cell according to the second embodiment is not a trapezoid that is elongated in one direction in plan view, but is a rectangle that is elongated in the one direction. Additionally, other aspects are the same, and the description thereof is omitted here.

As in the first embodiment, each of cells 2-1, 2-2 and 2-3 of the second embodiment has a main power generating region A2 in the middle where photoelectric conversion is actually performed, and end processed regions A1 and A1 at both ends thereof. The end processed region A1 is a region, of the main power generating region A2 of each cell, where a process is performed to prevent a short-circuit between an upper conductive layer 13 and a lower conductive layer 11, and also in the present embodiment, the end processed region A1 includes a scribed groove 6 where the upper conductive layer 13 and the semiconductor layer 12 (see FIG. 5) at both ends of the cell 2 are removed by a predetermined width g.

According to this second embodiment, sides (end surfaces 4) on both sides in the one direction of the cell are parallel to the other direction, and the scribed grooves 6 are formed along a straight line parallel to the sides (the end surfaces 4). Therefore, the main power generating region A2 is a rectangle in plan view, and the end processed region A1 is also a rectangle.

Then, in the second embodiment, when focusing on a first cell 2-1 and a second cell 2-2 that are adjacent to each other, an edge portion 16 of the second cell 2-2 that overlaps from above with one of edge portions 15 of the first cell 2-1 overlaps only within the range of the main power generating region A2 of the first cell 2-1 below. Likewise, when focusing on the second cell 2-2 and a third cell 2-3 that are adjacent to each other, an edge portion 16 of the third cell 2-3 that overlaps from above with an edge portion 15 of the second cell 2-2 overlaps only within the range of the main power generating region A2 of the second cell 2-2 below.

In this manner, also in the second embodiment, as in the first embodiment, the edge portion of one cell (the cell on the top), of the adjacent cells whose edge portions are overlapped, which overlaps from above with the edge portion of the other cell (the cell below) overlaps only within the range of the main power generating region A2 of the cell below.

Accordingly, in FIGS. 4 and 5, the second cell 2-2 on the top does not overlap from above with the end processed region A1 of the first cell 2-1 below. Therefore, the end processed region A1 (a part 13b of the upper conductive layer) of the first cell 2-1 below and the lower conductive layer 11 of the second cell 2-2 on the top are not short-circuited. Moreover, the third cell 2-3 on the top does not overlap from above with the end processed region A1 of the second cell 2-2 below. Accordingly, the end processed region A1 (a part of the upper conductive layer) of the second cell 2-2 below and the lower conductive layer 11 of the third cell 2-3 on the top are not short-circuited.

Therefore, according to the module 1, all the cells 2 are electrically connected in series, and useful voltage may be obtained.

Third Embodiment

Figure 6:
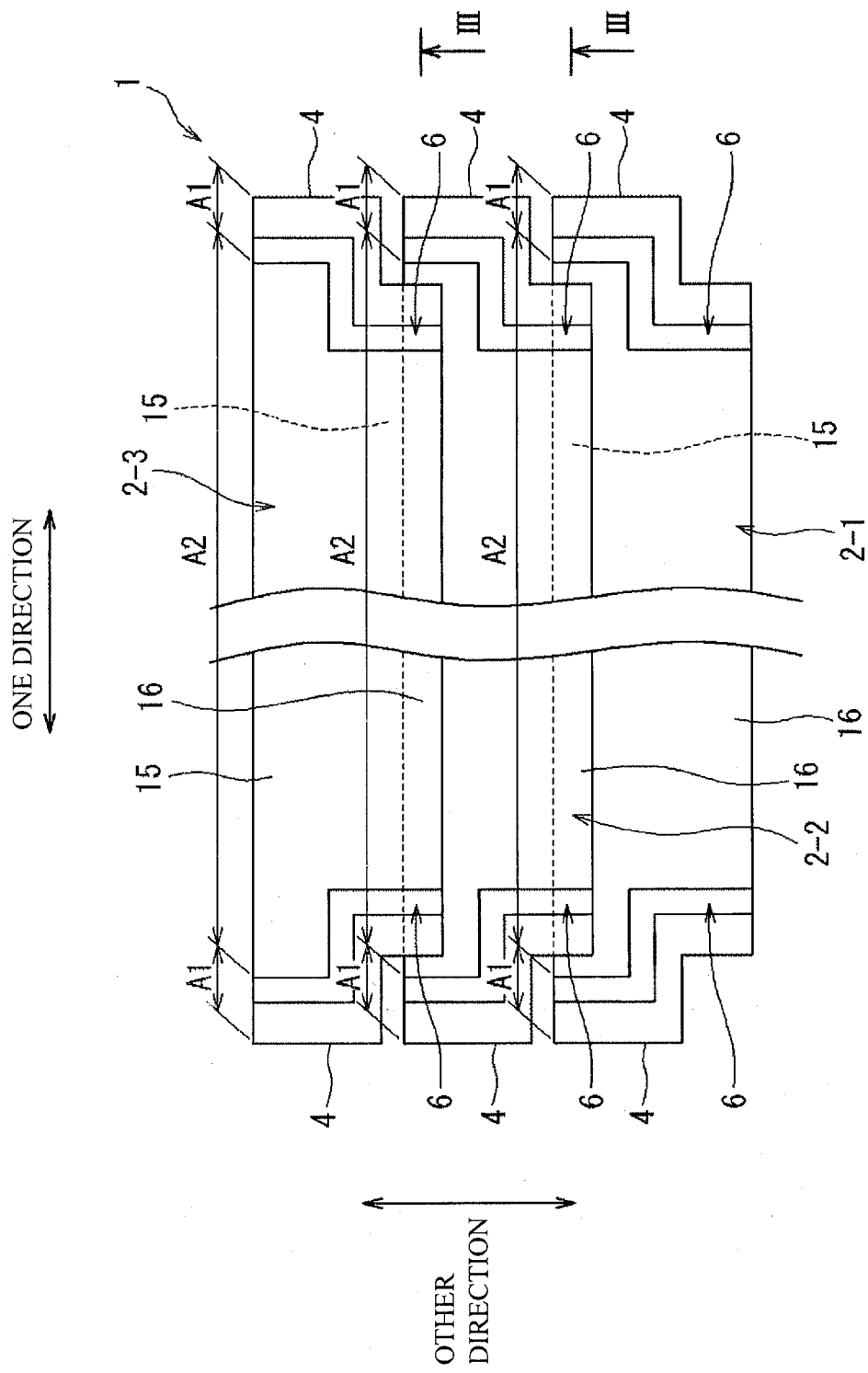
FIG. 6 is a plan view of a solar cell module according to a third embodiment.

FIG. 6 is a plan view of a module 1 according to a third embodiment. Additionally, the cross-sectional view of FIG. 6 in the direction of an arrow III is the same as FIG. 3. This third embodiment is an example modification of the first embodiment. When compared with the first embodiment (FIG. 2), the module 1 according to the third embodiment is different in the shape of a cell 2. That is, a cell 2 according to the third embodiment is not a trapezoid that is elongated in one direction in plan view, but is convex-shaped and is elongated in the one direction. Additionally, other aspects are the same, and the description thereof is omitted here. Moreover, a plurality of cells 2-1, 2-2 and 2-3 are all formed in the same manner.

Here, the first embodiment (FIG. 2) is described. For example, with respect to the first cell 2-1 and the second cell 2-2, the second cell 2-2 on the top and its main power generating region A2 are expanded in the one direction as they are separated in the other direction (the cell arrangement direction) from the overlapping edge portion 15 of the first cell 2-1 below, and the expansion in the one direction is linear expansion. That is, the cell 2-2 and the main power generating region A2 are trapezoid.

In contrast, in the third embodiment (FIG. 6), with respect to the first cell 2-1 and the second cell 2-2, for example, the second cell 2-2 on the top and its main power generating region A2 are expanded in the one direction as they are separated in the other direction (the cell arrangement direction) from the overlapping edge portion 15 of the first cell 2-1 below, and the expansion in the one direction is step-by-step expansion. As a result, the cell 2-2 and the main power generating region A2 are convex-shaped.

Additionally, in the present embodiment, to make the cell 2 and the main power generating region A2 convex-shaped, the sides (end surfaces 4) on both sides of the cell in the one direction are step-shaped, and also, scribed grooves 6 are formed to have a step-shape (a bent shape) so as to be parallel to these sides (the end surfaces 4).

In this manner, in the first embodiment and the third embodiment, the cell on the top and its main power generating region A2 are shaped to expand in the one direction as they are separated in the other direction from the overlapping edge portion of the cell below. This is different from the second embodiment.

Furthermore, in the case of the second embodiment (FIG. 4), the edge portion 16 of the second cell 2-2 to overlap from above with the edge portion 15 of the first cell 2-1 has a width equal to or less than a width dimension of the main power generating region A2 of the first cell 2-1 so as to overlap only within the range of the main power generating region A2. Moreover, since the second cell 2-2 is rectangle, the width of the second cell 2-2 is narrower than the width of the main power generating region A1 of the first cell 2-1. Furthermore, the overall width, and the width of the main power generating region A1, of the third cell 2-3 whose edge portion 16 overlaps from above with the second cell 2-2 are even narrower. Accordingly, the area of the main power generating region A2 is reduced as more and more cells are arranged next to one another in the other direction and the edge portions are overlapped with one another.

However, according to the first embodiment and the third embodiment, the second cell 2-2 and its main power generating region A2 on top of the first cell 2-1 are shaped to expand in the one direction as they are separated from the edge portion 15 of the first cell 2-1 below (trapezoid shape, convex shape), and thus, the areas of the second cell 2-2 on the top and its main power generating region A2 may be prevented from being reduced. Accordingly, the width of the third cell 2-3 that is to overlap from above with the second cell 2-2, and the width of a cell that is to further overlap are the same as the first cell 2-1, and gradual narrowing as in FIG. 2 may be prevented.

A manufacturing method of the solar cell module will now be described in detail. FIGS. 7(a) to 7(d) are explanatory views of a manufacturing method of a module 1. As, shown in FIG. 7(a), a belt-like metal material 22 wound around a roll 21 is sent out, various types of coating for forming a solar cell on the metal material 22, attaching of solder 5, and the like are performed, and this is cut into a predetermined length. An elongated cell 2 is thereby obtained as shown in FIG. 7(b) (a first step of cell manufacturing). As shown in FIG. 1, this cell 2 has a semiconductor layer 12 and an upper electrode 13a (an upper conductive layer 13) provided on top of a conductive substrate 11a (a lower conductive layer 11) made of the metal material. Additionally, attachment of the solder 5 may be performed in a step of overlapping edge portions of the cells 2 and 2 described later with each other.

Moreover, the manufacturing methods of the modules 1 of the first, second and third embodiments described above are the same except for the cut shape at the time of cutting. Accordingly, the case of the first embodiment (FIGS. 2 and 3) will be described below.

When elongated cells 2 cut into a predetermined length are obtained, a process for preventing a short-circuit of the upper conductive layer 13 and the lower conductive layer 11 at the main power generating region A2 is performed on both ends of each cell 2, as described using FIGS. 2 and 3, and the main power generating region A2 where photoelectric conversion is actually performed is formed in the middle region excluding the both ends (a second step of cell manufacturing).

Figure 7:
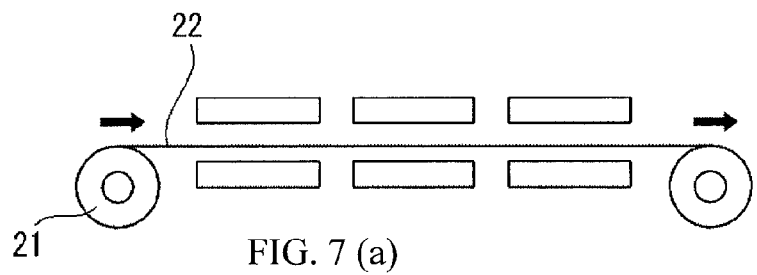
FIGS. 7(*a*), 7(*b*), 7(*c*) and 7(*d*) are explanatory views of a manufacturing method of a solar cell module.
Figure 7:
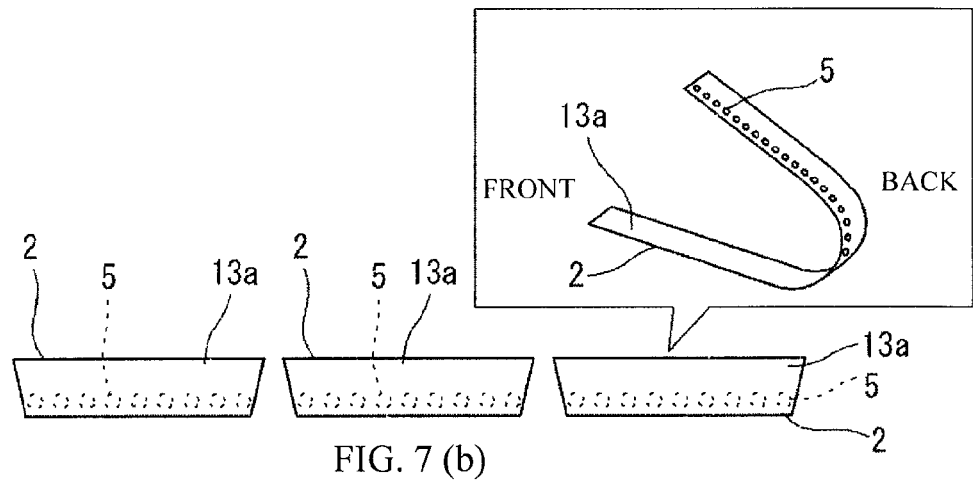
Figure 7:
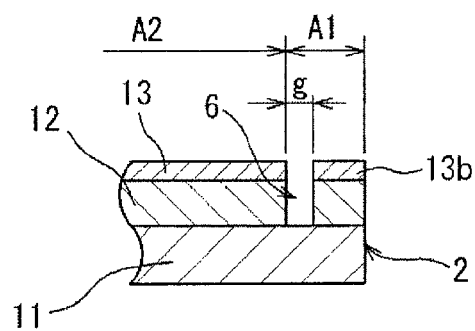
Figure 7:
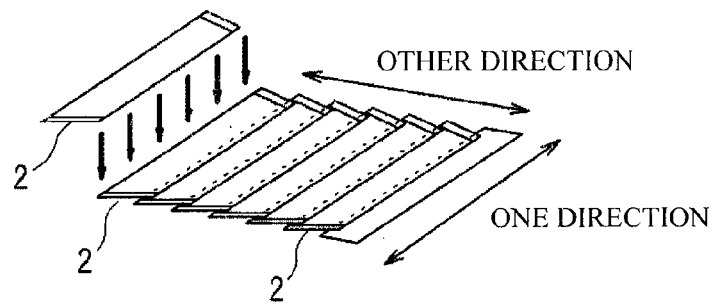

That is, in the second step of cell manufacturing, as shown in FIG. 7(*c*), a scribed groove 6 of a predetermined width g is formed at each of both ends of the cell 2 (one end is shown in FIG. 7(*c*)) by mechanically removing the upper conductive layer 13 and the semiconductor layer 12 along a direction parallel to the both sides of the cell 2. Then, an end region including the scribed groove 6 is taken as an end processed region A1, and the middle region excluding the end processed region A1 is taken as the main power generating region A2. The main power generating region A2 is a region where photoelectric conversion is actually performed, and is a region that is electrically connected in series with another cell 2 by being overlapped with the other cell 2 in a later bonding step.

Then, the cell 2 is inspected (an inspection step), and then, as shown in FIG. 7(*d*), a plurality of cells 2 are arranged next to one another in the other direction orthogonal to the longitudinal direction of the cells 2, and edge portions of adjacent cells 2 and 2 are sequentially overlapped with each other and are electrically and structurally connected (a bonding step). That is, the edge portions of adjacent cells 2 and 2 are overlapped with each other in such a way that the module 1 becomes long in the other direction, and this overlapping is performed for all the cells.

This bonding step is further described. By causing the edge portion of another cell 2 to overlap from above with the edge portion of a cell 2, the lower conductive layer 11 of the other cell 2 overlaps from above with the upper conductive layer 13 of the cell 2 below with the solder 5 interposed therebetween, and the edge portions are electrically and structurally connected. This bonding step is repeatedly performed for the plurality of cells 2, and as shown in FIG. 2, the edge portion of another cell is overlapped within the main power generating region A2 of the cell below in each bonding step.

That is, one edge portion 16 of the second cell 2-2 is overlapped within the main power generating region A2 at the edge portion 15 of the first cell 2-1, and one edge portion 16 of the third cell 2-3 is overlapped within the main power generating region A2 at the other edge portion 15 of the second cell 2-2. This overlapping is sequentially performed. Then, every time the edge portions are overlapped, or after all the cells have been overlapped, the adjacent cells are bonded by the solder 5.

Then, the cover members 10 shown in FIG. 1 cover the plurality of cells from above and below (a finishing step), and one module 1 is obtained.

A solar cell module 1 is manufactured in this manner, and with respect to the module 1 manufactured by this manufacturing method, as shown in FIG. 3, the end processed region A1 (the upper conductive layer 13*b* in the region A1) of the first cell 2-1 and the lower conductive layer 11 of the second cell 2-2 are not short-circuited, and also, although not shown in the drawing, the end processed region A1 (the upper conductive layer 13*b* in the region A1) of the second cell 2-2 and the lower conductive layer 11 of the third cell 2-3 are not short-circuited, and a short-circuit conventionally occurring between adjacent cells may be prevented by a simple structure.

Figure 8:
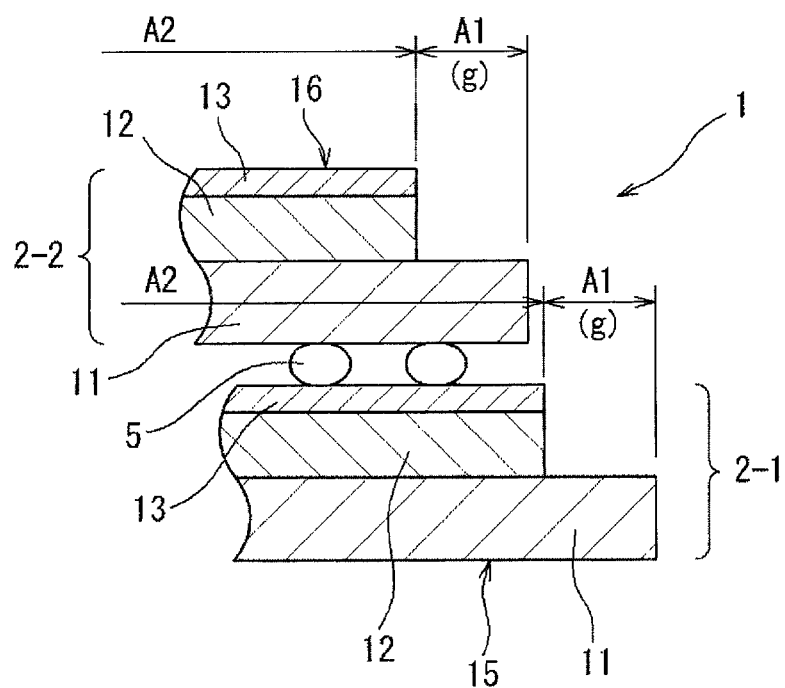
FIG. 8 is a cross-sectional view of a solar cell module.
Figure 9:
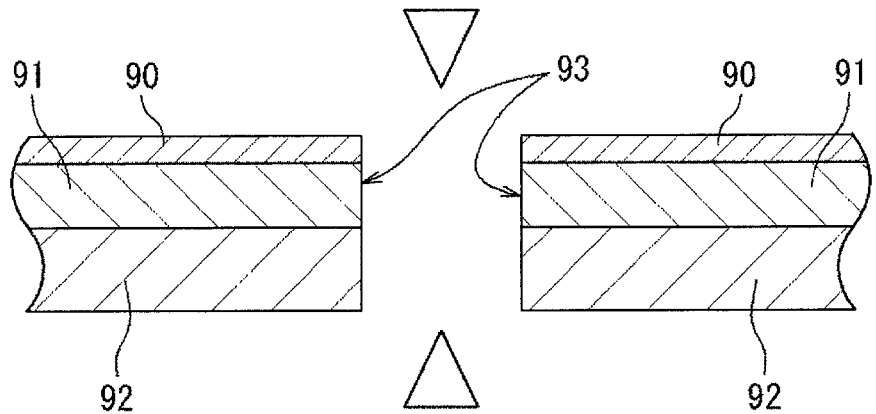
FIGS. 9(*a*), 9(*b*) and 9(*c*) are explanatory views of a solar cell of a conventional solar cell module.
Figure 9:
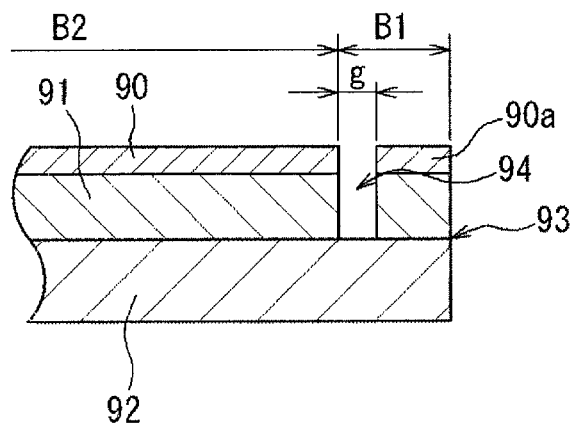
Figure 9:
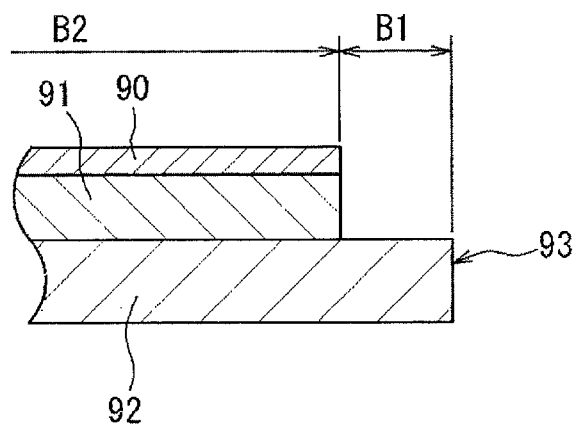
Figure 10:
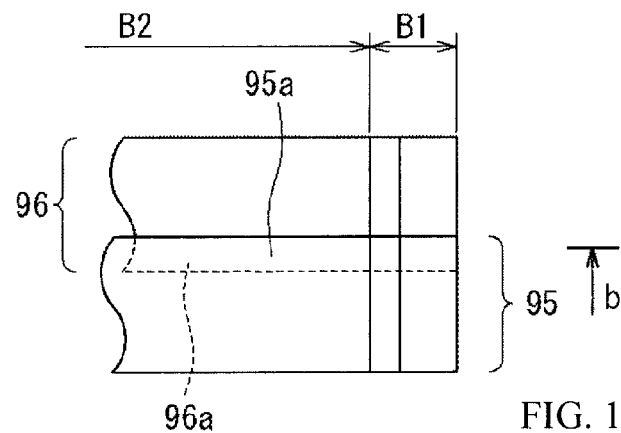
FIGS. 10(*a*), 10(*b*) and 10(*c*) are explanatory views of a conventional solar cell module.
Figure 10:
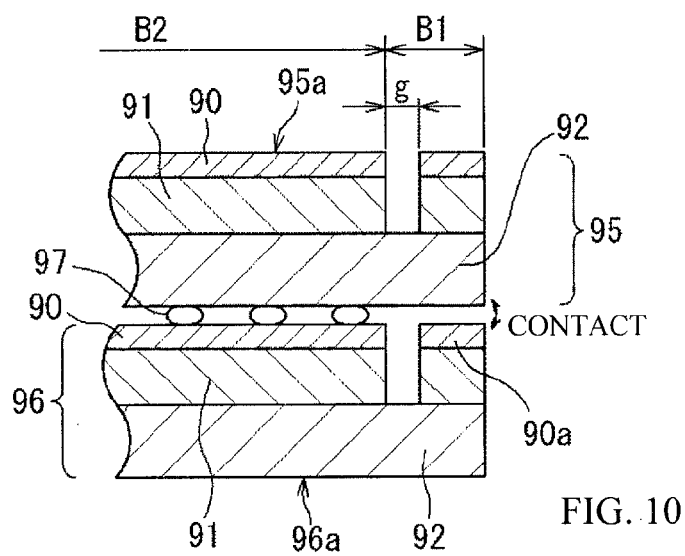
Figure 10:
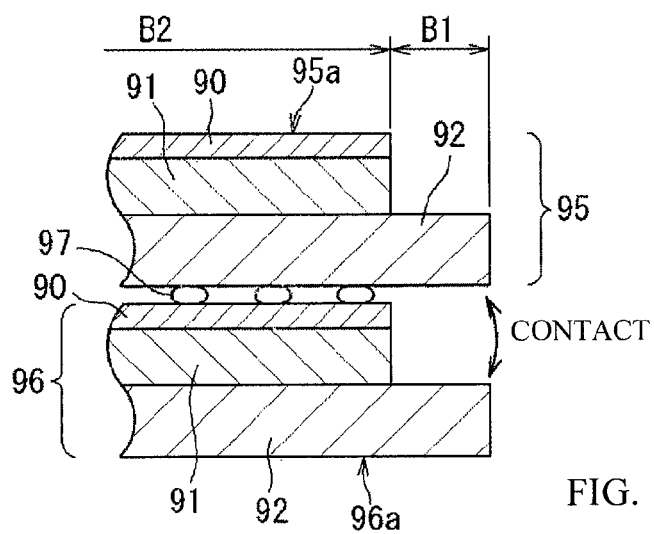

Additionally, in each of the embodiments described above, a case is described where the scribed grooves 6 are formed at both ends in the one direction of the cell 2, and where the end region including a groove 6 is taken as the end processed region A1, but the end processed region A1 may be other than the above, and as shown in FIG. 8, it may be a region where at least the upper conductive layer 13 is blasted and removed by the predetermined width g with respect to the end portion of the cell 2. With the end processed region A 1 in FIG. 8, as with the scribed groove 6, a short-circuit between the upper conductive layer 13 and the lower conductive layer 11 may be prevented at the main power generating region A2 of each cell 2.

Furthermore, the modes of the solar cell module of the present invention and the manufacturing method thereof are not limited to the modes shown in the drawings, and may be other modes within the scope of the present invention. The cell 2 may be other than a shape whose width increases linearly (a trapezoid) or a shape whose width increases step by step (a convex shape). Moreover, in the case of the width increasing step by step, the width is increased by one step in the embodiment described above (FIG. 6), but it may also be increased step by step over a plurality of steps. In the embodiment described above, the description is given assuming that the semiconductor layer 12 is the power generating layer, but this is not restrictive, and the power generating layer may also be an organic compound layer or the like.

The invention claimed is:

1. A solar cell module comprising:
a plurality of solar cells arranged next to one another in a first direction orthogonal to a second direction of the solar cells, the solar cells each being longer in the second direction than in the first direction and including a lower conductive layer, an upper conductive layer, and a power generating layer between the upper and lower conductive layers, each of the solar cells having first and second edge portions that are opposite to each other in the first direction, adjacent solar cells of the solar cells being partially overlapped and electrically connected with each other, each of the solar cells further including end processed regions at both ends thereof in the second direction and a main power generating region in a middle portion thereof between the end processed regions in the second direction, the end processed regions having a short-circuit prevention property that prevents a short-circuit between the upper conductive layer and the lower conductive layer, the main power generating region having a photoelectric conversion property that performs photoelectric conversion, and a first edge portion of one of the adjacent solar cells that overlaps from above with a second edge portion of the other one of the adjacent solar cells being shorter in the second direction than the second edge portion of the other one of the adjacent solar cells, the first edge portion of the one of the adjacent solar cells overlapping from above with the second edge portion of the other one of the adjacent solar cells only at the main power generating region of the other one of the adjacent solar cells such that the first edge portion of the one of the adjacent solar cells does not overlap with the second edge portion of the other one of the adjacent solar cells at the end processed regions of the other one of the adjacent solar cells.

2. The solar cell module according to claim 1, wherein the one of the adjacent solar cells and the main power generating region thereof have lengths measured in the second direction that increase as moving away from the second edge portion of the other one of the adjacent solar cells.

3. The solar cell module according to claim 1, wherein each of the solar cells has an overall trapezoidal shape.

4. The solar cell module according to claim 3, wherein the solar cells have the same size relative to each other.

5. The solar cell module according to claim 1, wherein each of the solar cells has an overall rectangular shape.

6. The solar cell module according to claim 5, wherein the solar cells have different sizes relative to each other.

7. The solar cell module according to claim 1, wherein each of the solar cells has an overall stepwise shape.

8. The solar cell module according to claim 7, wherein the solar cells have the same size relative to each other.

9. A manufacturing method of a solar cell module comprising:

arranging a plurality of solar cells next to one another in a first direction orthogonal to a second direction of the solar cells, the solar cells each being longer in the second direction than in the first direction and including a lower conductive layer, an upper conductive layer, and a power generating layer between the upper and lower conductive layers, each of the solar cells having first and second edge portions that are opposite to each other in the first direction;

performing a process to provide end processed regions at both ends of each of the solar cells in the second direction, the end processed regions having a short-circuit prevention property that prevents a short-circuit between the upper conductive layer and the lower conductive layer;

forming a main power generating region having a photoelectric conversion property that performs photoelectric conversion in a middle portion of each of the solar cells between the end processed regions in the second direction; and electrically connecting adjacent solar cells of the solar cells such that a first edge portion of one of the adjacent solar cells overlaps from above with a second edge portion of the other one of the adjacent solar cells and such that the lower conductive layer of the one of the adjacent solar cells overlaps from above with the upper conductive layer of the other one of the adjacent solar cells, with the first edge portion of the one of the adjacent solar cells being shorter in the second direction than the second edge portion of the other one of the adjacent solar cells, the connecting of the adjacent solar cells being repeatedly performed for the plurality of solar cells such that the first edge portion of the one of the adjacent solar cells overlaps from above with the second edge portion of the other one of the adjacent solar cells only at the main power generating region of the other one of the adjacent solar cells such that the first edge portion of the one of the adjacent solar cells does not overlap with the second edge portion of the other one of the adjacent solar cells at the end processed regions of the other one of the adjacent solar cells.

* * * * *